US010651280B2

(12) United States Patent
Ota et al.

(10) Patent No.: US 10,651,280 B2
(45) Date of Patent: May 12, 2020

(54) SILICON CARBIDE SEMICONDUCTOR DEVICE

(71) Applicant: KABUSHIKI KAISHA TOSHIBA, Minato-ku (JP)

(72) Inventors: Chiharu Ota, Kawasaki (JP); Tatsunori Sakano, Shinagawa (JP); Ryosuke Iijima, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 66 days.

(21) Appl. No.: 16/100,263

(22) Filed: Aug. 10, 2018

(65) Prior Publication Data
US 2019/0273134 A1 Sep. 5, 2019

(30) Foreign Application Priority Data
Mar. 2, 2018 (JP) ................... 2018-037449

(51) Int. Cl.
*H01L 29/16* (2006.01)
*H01L 29/08* (2006.01)
(Continued)

(52) U.S. Cl.
CPC .... *H01L 29/1608* (2013.01); *H01L 21/02378* (2013.01); *H01L 29/086* (2013.01);
(Continued)

(58) Field of Classification Search
CPC ............... H01L 29/1608; H01L 29/086; H01L 29/0878; H01L 29/66068; H01L 29/7802
See application file for complete search history.

(56) References Cited

U.S. PATENT DOCUMENTS 6,107,142 A     8/2000   Suvorov et al.
6,165,822 A * 12/2000   Okuno ................. H01L 21/049
                                                                                              438/142

(Continued)

FOREIGN PATENT DOCUMENTS

JP    2006-511961      4/2006
JP    2011-134861      7/2011
(Continued)

OTHER PUBLICATIONS

S. Hino, et al., "Demonstration of SiC-MOSFET Embedding Schottky Barrier Diode for Inactivation of Parasitic Body Diode," Materials Science Forum, silicon Carbide and Related Materials 2016, vol. 897, pp. 477-480.

*Primary Examiner* — Ida M Soward
(74) *Attorney, Agent, or Firm* — Oblon, McClelland, Maier & Neustadt, L.L.P.

(57) ABSTRACT

According to one embodiment, a semiconductor device includes first to third electrodes, first to fourth semiconductor regions, and a first insulating portion. The first semiconductor region includes first to third partial regions. The first partial region is provided between the first electrode and the second electrode. The second partial region is provided between the first and third electrodes. The second semiconductor region includes fourth to sixth partial regions. The fourth partial region is provided between the first partial region and the second electrode. The fifth partial region is provided between the third semiconductor region and at least a portion of the second partial region. The sixth partial region is provided between the third partial region and the third semiconductor region. The fourth semiconductor region is provided between the first and fourth partial regions. The first insulating portion is provided between the second partial region and the third electrode.

20 Claims, 7 Drawing Sheets

(51) Int. Cl.
  *H01L 29/66* (2006.01)
  *H01L 29/78* (2006.01)
  *H01L 21/02* (2006.01)

(52) U.S. Cl.
  CPC .... *H01L 29/0878* (2013.01); *H01L 29/66068* (2013.01); *H01L 29/7802* (2013.01)

(56) References Cited

U.S. PATENT DOCUMENTS

| | | | |
|---|---|---|---|
| 6,573,534 B1* | 6/2003 | Kumar | H01L 29/1608 257/77 |
| 6,576,929 B2* | 6/2003 | Kumar | H01L 29/66068 257/289 |
| 6,600,192 B1* | 7/2003 | Sugawara | H01L 29/1066 257/329 |
| 6,930,352 B2* | 8/2005 | Saito | H01L 29/0634 257/330 |
| 7,221,010 B2 | 5/2007 | Ryu | |
| 7,365,363 B2* | 4/2008 | Kojima | H01L 21/02024 257/328 |
| 7,728,336 B2* | 6/2010 | Yatsuo | H01L 29/086 257/77 |
| 7,732,821 B2* | 6/2010 | Suzuki | H01L 21/0465 257/335 |
| 8,003,991 B2* | 8/2011 | Yatsuo | H01L 21/8213 257/328 |
| 8,120,074 B2* | 2/2012 | Schulze | H01L 29/0834 257/139 |
| 8,188,521 B2* | 5/2012 | Saito | H01L 29/0634 257/288 |
| 8,283,720 B2* | 10/2012 | Saito | H01L 29/0634 257/328 |
| 8,502,281 B2* | 8/2013 | Willmeroth | H01L 29/0634 257/263 |
| 8,728,923 B2* | 5/2014 | Kawai | H01L 21/0485 257/E21.054 |
| 8,963,242 B2* | 2/2015 | Saito | H01L 29/0878 257/341 |
| 9,184,230 B2* | 11/2015 | Harada | H01L 29/7802 |
| 9,349,721 B2* | 5/2016 | Saito | H01L 27/0727 |
| 9,627,486 B2* | 4/2017 | Iwamuro | H01L 29/1608 |
| 9,793,392 B2* | 10/2017 | Kinoshita | H01L 29/7397 |
| 9,978,843 B2* | 5/2018 | Takayanagi | H01L 29/1608 |
| 10,079,298 B2* | 9/2018 | Kinoshita | H01L 29/7811 |
| 10,090,407 B2* | 10/2018 | Tashima | H01L 21/02529 |
| 10,096,680 B2* | 10/2018 | Kumagai | H01L 29/0865 |
| 10,096,703 B2* | 10/2018 | Harada | H01L 29/1095 |
| 10,211,331 B2* | 2/2019 | Ichijo | H01L 29/7803 |
| 10,374,075 B2* | 8/2019 | Tominaga | H01L 29/1608 |
| 10,453,923 B2* | 10/2019 | Ohse | H01L 21/0485 |
| 2012/0098030 A1* | 4/2012 | Schulze | H01L 29/0834 257/139 |
| 2014/0034965 A1 | 2/2014 | Ota et al. | |
| 2015/0270351 A1 | 9/2015 | Nishio et al. | |
| 2016/0005605 A1 | 1/2016 | Nishio et al. | |
| 2016/0035821 A1* | 2/2016 | Pfirsch | H01L 29/083 257/139 |
| 2016/0276468 A1* | 9/2016 | Izumisawa | H01L 29/7395 |
| 2017/0025410 A1 | 1/2017 | Cheng et al. | |
| 2017/0345891 A1* | 11/2017 | Van Brunt | H01L 29/0634 |
| 2017/0365709 A1* | 12/2017 | Ohashi | H01L 29/1095 |
| 2018/0097103 A1 | 4/2018 | Sadamatsu et al. | |

FOREIGN PATENT DOCUMENTS

| | | |
|---|---|---|
| JP | 5184724 | 4/2013 |
| JP | 2014-045167 | 3/2014 |
| JP | 2015-135954 | 7/2015 |
| JP | 2015-159234 | 9/2015 |
| JP | 2015-179787 | 10/2015 |
| JP | 2016-018861 | 2/2016 |
| JP | 2016-213473 | 12/2016 |
| JP | 6058228 | 1/2017 |
| WO | WO 2016/092887 A1 | 6/2016 |

* cited by examiner

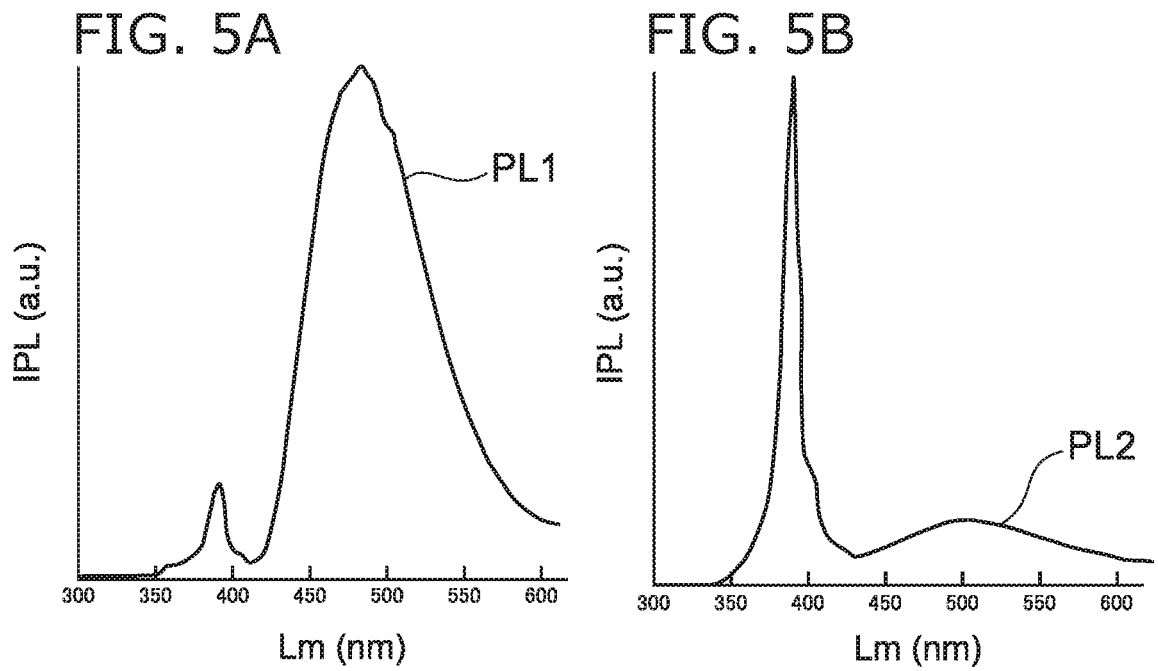
FIG. 5A
FIG. 5B
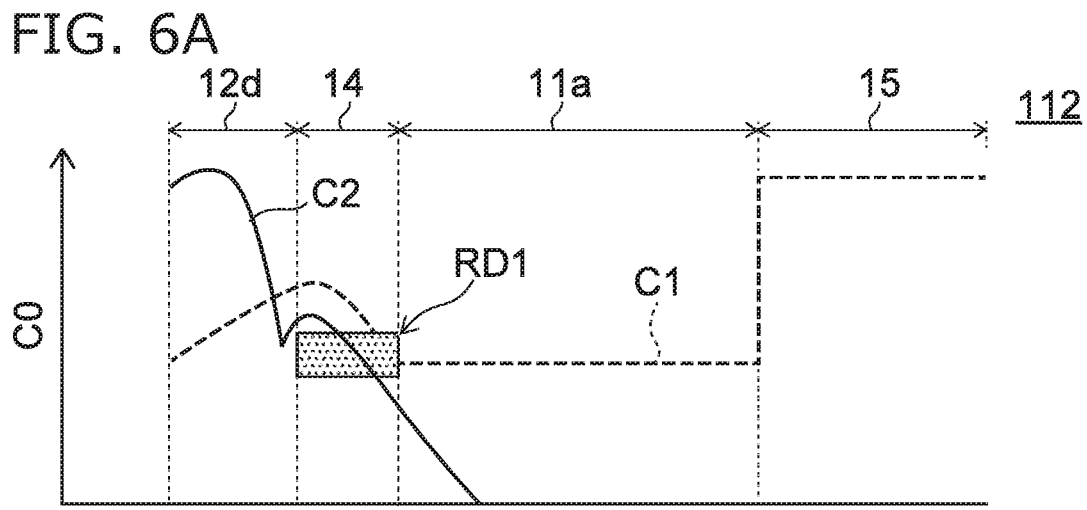
FIG. 6A
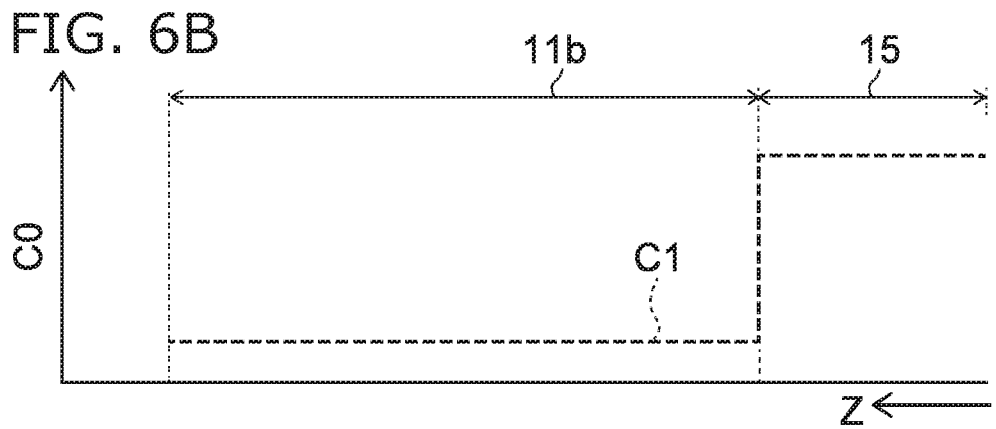
FIG. 6B

SILICON CARBIDE SEMICONDUCTOR DEVICE

CROSS-REFERENCE TO RELATED APPLICATIONS

This application is based upon and claims the benefit of priority from Japanese Patent Application No. 2018-037449, filed on Mar. 2, 2018; the entire contents of which are incorporated herein by reference.

FIELD

Embodiments described herein relate generally to a semiconductor device.

BACKGROUND

It is desirable to stabilize the characteristics of a semiconductor device.

BRIEF DESCRIPTION OF THE DRAWINGS

FIG. 5A and FIG. 5B are graphs illustrating the characteristics of the semiconductor device;

FIG. 6A and FIG. 6B are schematic views illustrating a semiconductor device according to a third embodiment;

DETAILED DESCRIPTION

Figure 1:
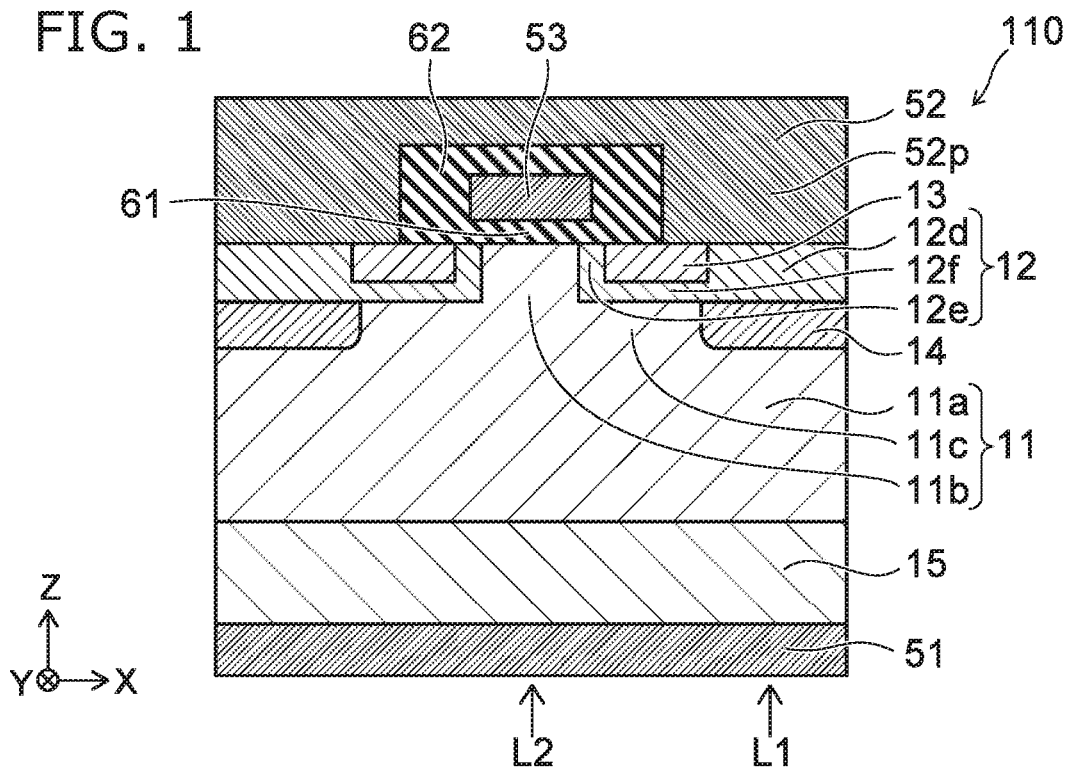
FIG. 1 is a schematic cross-sectional view illustrating a semiconductor device according to a first embodiment.

According to one embodiment, a semiconductor device includes first to third electrodes, first to fourth semiconductor regions, and a first insulating portion. A direction from the first electrode toward a portion of the second electrode is aligned with a first direction. A direction from the first electrode toward the third electrode is aligned with the first direction. A second direction from the third electrode toward the portion of the second electrode crosses the first direction. The first semiconductor region includes silicon carbide of a first conductivity type. The first semiconductor region includes first to third partial regions. The first partial region is provided between the first electrode and the portion of the second electrode in the first direction. The second partial region is provided between the first electrode and the third electrode in the first direction. A position along the second direction of the third partial region is between a position along the second direction of the first partial region and a position along the second direction of the second partial region. The second semiconductor region includes silicon carbide of a second conductivity type. The second semiconductor region includes fourth to sixth partial regions. The fourth partial region is provided between the first partial region and the portion of the second electrode in the first direction. The third semiconductor region includes silicon carbide of the first conductivity type and is electrically connected to the portion of the second electrode. The fifth partial region is provided between the third semiconductor region and at least a portion of the second partial region in the second direction. The sixth partial region is provided between the third partial region and the third semiconductor region in the first direction. The fourth semiconductor region includes silicon carbide, includes at least one first element selected from the group consisting of Ar, Kr, Xe, Rn, Ti, and V, and is provided between the first partial region and the fourth partial region in the first direction. The first insulating portion is provided between the second partial region and the third electrode.

According to another embodiment, a semiconductor device includes first to third electrodes, first to fourth semiconductor regions, and a first insulating portion. A direction from the first electrode toward a portion of the second electrode is aligned with a first direction. A direction from the first electrode toward the third electrode is aligned with the first direction. A second direction from the third electrode toward the portion of the second electrode crosses the first direction. The first semiconductor region includes silicon carbide of a first conductivity type. The first semiconductor region includes first to third partial regions. The first partial region is provided between the first electrode and the portion of the second electrode in the first direction. The second partial region is provided between the first electrode and the third electrode in the first direction. A position along the second direction of the third partial region is between a position along the second direction of the first partial region and a position along the second direction of the second partial region. The second semiconductor region includes silicon carbide of a second conductivity type. The second semiconductor region includes fourth to sixth partial regions. The fourth partial region is provided between the first partial region and the portion of the second electrode in the first direction. The third semiconductor region includes silicon carbide of the first conductivity type and is electrically connected to the portion of the second electrode. The fifth partial region is provided between the third semiconductor region and at least a portion of the second partial region in the second direction. The sixth partial region is provided between the third partial region and the third semiconductor region in the first direction. The fourth semiconductor region includes silicon carbide and is provided between the first partial region and the fourth partial region in the first direction. A concentration of a first element in the fourth semiconductor region is higher than a concentration of the first element in the first partial region. The first element is at least one of silicon or carbon. The first insulating portion is provided between the second partial region and the third electrode.

According to another embodiment, a semiconductor device includes first to third electrodes, first to fourth semiconductor regions, and a first insulating portion. A direction from the first electrode toward a portion of the second electrode is aligned with a first direction. A direction from the first electrode toward the third electrode is aligned with the first direction. A second direction from the third electrode toward the portion of the second electrode crosses the first direction. The first semiconductor region includes silicon carbide of a first conductivity type. The first semiconductor region includes first to third partial regions. The first partial region is provided between the first electrode and the portion of the second electrode in the first direction. The second partial region is provided between the first electrode and the third electrode in the first direction. A position along the second direction of the third partial region is between a position along the second direction of the first partial region and a position along the second direction of the second partial region. The second semiconductor region includes silicon carbide of a second conductivity type. The second semiconductor region includes fourth to sixth partial regions. The fourth partial region is provided between the first partial region and the portion of the second electrode in the first direction. The third semiconductor region includes silicon carbide of the first conductivity type and is electrically connected to the portion of the second electrode. The fifth partial region is provided between the third semiconductor region and at least a portion of the second partial region in the second direction. The sixth partial region is provided between the third partial region and the third semiconductor region in the first direction. The fourth semiconductor region includes silicon carbide and is provided between the first partial region and the fourth partial region in the first direction. The first insulating portion is provided between the second partial region and the third electrode. The first partial region includes a first element including at least one selected from the group consisting of nitrogen and phosphorus. The fourth partial region includes a second element including at least one selected from the group consisting of aluminum and boron. The fourth semiconductor region includes the first element and the second element. The fourth partial region does not include the first element, or the fourth partial region includes the first element. A first concentration of the first element included in the fourth partial region is lower than a second concentration of the second element included in the fourth partial region, and a difference between the first concentration and the second concentration is larger than a difference between a third concentration and a fourth concentration. The third concentration is of the first element included in the fourth semiconductor region. The fourth concentration is of the second element included in the fourth semiconductor region.

According to another embodiment, a semiconductor device includes first to third electrodes, first to fourth semiconductor regions, and a first insulating portion. A direction from the first electrode toward a portion of the second electrode is aligned with a first direction. A direction from the first electrode toward the third electrode is aligned with the first direction. A second direction from the third electrode toward the portion of the second electrode crosses the first direction. The first semiconductor region includes silicon carbide of a first conductivity type. The first semiconductor region includes first to third partial regions. The first partial region is provided between the first electrode and the portion of the second electrode in the first direction. The second partial region is provided between the first electrode and the third electrode in the first direction. A position along the second direction of the third partial region is between a position along the second direction of the first partial region and a position along the second direction of the second partial region. The second semiconductor region includes silicon carbide of a second conductivity type. The second semiconductor region includes fourth to sixth partial regions. The fourth partial region is provided between the first partial region and the portion of the second electrode in the first direction. The third semiconductor region includes silicon carbide of the first conductivity type and is electrically connected to the portion of the second electrode. The fifth partial region is provided between the third semiconductor region and at least a portion of the second partial region in the second direction. The sixth partial region is provided between the third partial region and the third semiconductor region in the first direction. The fourth semiconductor region includes silicon carbide and is provided between the first partial region and the fourth partial region in the first direction. The first insulating portion is provided between the second partial region and the third electrode. The fourth semiconductor region and the second partial region have one of first to third states. In the first state, the fourth semiconductor region has tensile stress, and the second partial region has compressive stress. In the second state, the fourth semiconductor region has tensile stress, the second partial region has tensile stress, and the tensile stress in the fourth semiconductor region is larger than the tensile stress in the second partial region. In the third state, the fourth semiconductor region has compressive stress, the second partial region has compressive stress, and the compressive stress in the fourth semiconductor region is smaller than the compressive stress in the second partial region.

According to another embodiment, a semiconductor device includes first to third electrodes. A direction from the first electrode toward a portion of the second electrode is aligned with a first direction. A direction from the first electrode toward the third electrode is aligned with the first direction. A second direction from the third electrode toward the portion of the second electrode crosses the first direction. The first semiconductor region includes silicon carbide of a first conductivity type. The first semiconductor region includes first to third partial regions. The first partial region is provided between the first electrode and the portion of the second electrode in the first direction. The second partial region is provided between the first electrode and the third electrode in the first direction. A position along the second direction of the third partial region is between a position along the second direction of the first partial region and a position along the second direction of the second partial region. The second semiconductor region includes silicon carbide of a second conductivity type. The second semiconductor region includes fourth to sixth partial regions. The fourth partial region is provided between the first partial region and the portion of the second electrode in the first direction. The third semiconductor region includes silicon carbide of the first conductivity type and is electrically connected to the portion of the second electrode. The fifth partial region is provided between the third semiconductor region and at least a portion of the second partial region in the second direction. The sixth partial region is provided between the third partial region and the third semiconductor region in the first direction. The fourth semiconductor region includes silicon carbide and is provided between the first partial region and the fourth partial region in the first direction. The first insulating portion is provided between the second partial region and the third electrode. A ratio of an intensity at 500 nanometers for a photoluminescence of the fourth semiconductor region to an intensity at 380 nanometers for the photoluminescence of the fourth semiconductor region is higher than a ratio of an intensity at 500 nanometers for a photoluminescence of the second partial region to an intensity at 380 nanometers for the photoluminescence of the second partial region.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes a first electrode 51, a second electrode 52, a third electrode 53, a first semiconductor region 11, a second semiconductor region 12, a third semiconductor region 13, a fourth semiconductor region 14, and a first insulating portion 61.

The direction from the first electrode 51 toward a portion 52p of the second electrode 52 is aligned with a first direction. For example, the second electrode 52 is separated from the first electrode 51 in the first direction. The entire second electrode 52 may be the portion 52p recited above. In such a case, the "portion 52p" is the "second electrode 52."

The first direction is taken as a Z-axis direction. One direction perpendicular to the Z-axis direction is taken as an X-axis direction. A direction perpendicular to the Z-axis direction and the X-axis direction is taken as a Y-axis direction.

The direction from the first electrode 51 toward the third electrode 53 is aligned with the first direction (the Z-axis direction) recited above. A second direction from the third electrode 53 toward the portion 52p of the second electrode 52 recited above crosses the first direction. The second direction is, for example, the X-axis direction.

The first semiconductor region 11 includes silicon carbide (SiC) of a first conductivity type. The first semiconductor region 11 includes first to third partial regions 11a to 11c.

The first partial region 11a is provided between the first electrode 51 and the portion 52p of the second electrode 52 recited above in the first direction (the Z-axis direction).

The second partial region 11b is provided between the first electrode 51 and the third electrode 53 in the first direction.

The position along the second direction (e.g., the X-axis direction) of the third partial region 11c is between the position along the second direction of the first partial region 11a and the position along the second direction of the second partial region 11b.

The second semiconductor region 12 includes silicon carbide of a second conductivity type.

The first conductivity type is, for example, an n-type. In such a case, the second conductivity type is a p-type. The first conductivity type may be the p-type; and the second conductivity type may be the n-type. Hereinbelow, the first conductivity type is taken to be the n-type; and the second conductivity type is taken to be the p-type.

The second semiconductor region 12 includes fourth to sixth partial regions 12d to 12f. The fourth partial region 12d is provided between the first partial region 11a and the portion 52p of the second electrode 52 recited above in the first direction (the Z-axis direction).

The third semiconductor region 13 includes silicon carbide of the first conductivity type. The third semiconductor region 13 is electrically connected to the portion 52p of the second electrode 52 recited above.

The fifth partial region 12e of the second semiconductor region 12 is provided between the third semiconductor region 13 and at least a portion of the second partial region 11b in the second direction (e.g., the X-axis direction). The sixth partial region 12f of the second semiconductor region 12 is provided between the third partial region 11c and the third semiconductor region 13 in the first direction (the Z-axis direction).

The fourth semiconductor region 14 is provided between the first partial region 11a and the fourth partial region 12d in the first direction (the Z-axis direction). The fourth semiconductor region includes at least one first element selected from the group consisting of Ar, Kr, Xe, Rn, Ti, and V. The fourth semiconductor region 14 includes silicon carbide.

The first insulating portion 61 is provided between the second partial region 11b and the third electrode 53. A second insulating portion 62 is provided in the example. The second insulating portion 62 is provided between the second electrode 52 and the third electrode 53.

For example, the impurity concentration of the first conductivity type in the third semiconductor region 13 is higher than the impurity concentration of the first conductivity type in the first semiconductor region 11.

The first semiconductor region 11 is, for example, an $n^-$-region. The second semiconductor region 12 is, for example, a p region. The third semiconductor region 13 is, for example, an $n^+$-region.

For example, the first electrode 51 functions as a drain electrode. The second electrode 52 functions as a source electrode. The third electrode 53 functions as a gate electrode. For example, the first insulating portion 61 functions as a gate insulating film. The semiconductor device 110 is, for example, a SiC transistor.

A fifth semiconductor region 15 is provided in the example. The fifth semiconductor region 15 is provided between the first electrode 51 and the first semiconductor region 11. The fifth semiconductor region 15 may include silicon carbide of the first conductivity type. The impurity concentration of the first conductivity type in the fifth semiconductor region 15 is higher than the impurity concentration of the first conductivity type in the first semiconductor region 11. The fifth semiconductor region 15 is, for example, an $n^+$-SiC substrate. In such a case, the semiconductor device 110 is a MOS transistor.

In the embodiment, the fifth semiconductor region 15 may include silicon carbide of the second conductivity type. In such a case, the semiconductor device 110 is an IGBT. A case will now be described where the fifth semiconductor region 15 is of the first conductivity type. The description recited below is applicable even in the case where the fifth semiconductor region 15 is of the second conductivity type.

In the embodiment, the fourth semiconductor region 14 is provided under the source portion. For example, the concentrations of the elements other than Si and C in the fourth semiconductor region 14 are higher than the concentrations in the other semiconductor regions.

For example, the fourth semiconductor region 14 includes the first element (at least one selected from the group consisting of Ar, Kr, Xe, Rn, Ti, and V). For example, the first semiconductor region 11 substantially does not include the first element. Or, the concentration of the first element in the first semiconductor region 11 is lower than the concentration of the first element in the fourth semiconductor region 14. The concentration of the first element in the first semiconductor region 11 may be not less than $1 \times 10^{12}$ cm$^{-3}$ and not more than $1 \times 10^{13}$ cm$^{-3}$.

In the operation of the semiconductor device 110, there are cases where at least a constant amount of holes from the source portion reaches the portion of the first semiconductor region 11 on the electrode 51 side (the "lower portion" for convenience hereinbelow). Thereby, there are cases where the characteristics degrade between the source portion and the diode portion of the drain portion. For example, compared to the other regions, the minority carrier lifetime is short in the fourth semiconductor region 14. By providing the fourth semiconductor region 14 recited above in the embodiment, the holes from the source portion that reach the "lower portion" of the first semiconductor region 11 can be reduced. Thereby, for example, the degradation of the characteristics of the body diode occurring due to the holes reaching the "lower portion" of the first semiconductor region 11 can be suppressed.

According to the embodiment, a semiconductor device can be provided in which it is possible to stabilize the characteristics.

An example of distributions of the first element in the semiconductor device 110 will now be described. In the following example, an example of the distributions of the concentrations of the elements in the depth direction along a first line L1 and a second line L2 shown in FIG. 1 is described. These lines are aligned with the Z-axis direction. The first line L1 passes through the fourth partial region 12d, the fourth semiconductor region 14, the first partial region 11a, and the fifth semiconductor region 15. The first line L1 corresponds to the source portion. The second line L2 passes through the second partial region 11b and the fifth semiconductor region 15. The second line L2 corresponds to a gate portion (a channel portion).

Figure 2A:
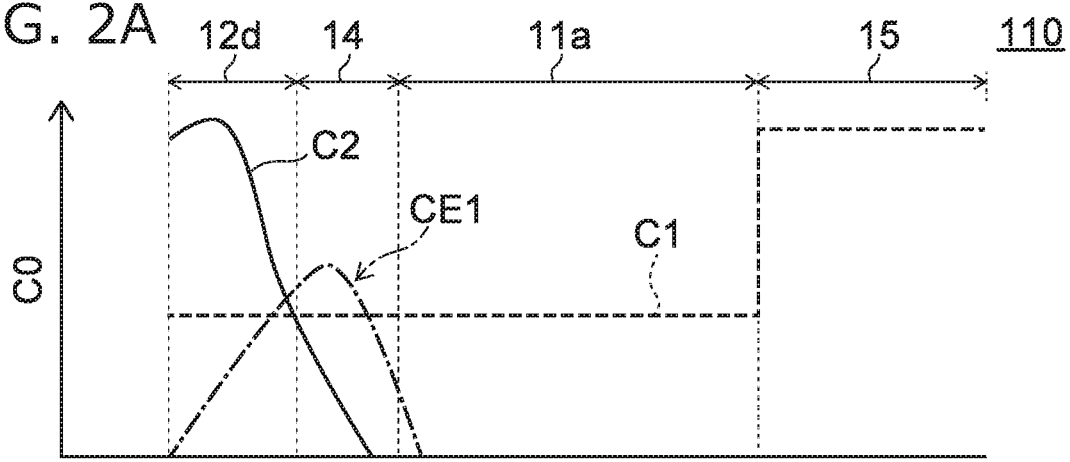
FIG. 2A and FIG. 2B are schematic views illustrating the semiconductor device according to the first embodiment.
Figure 2B:
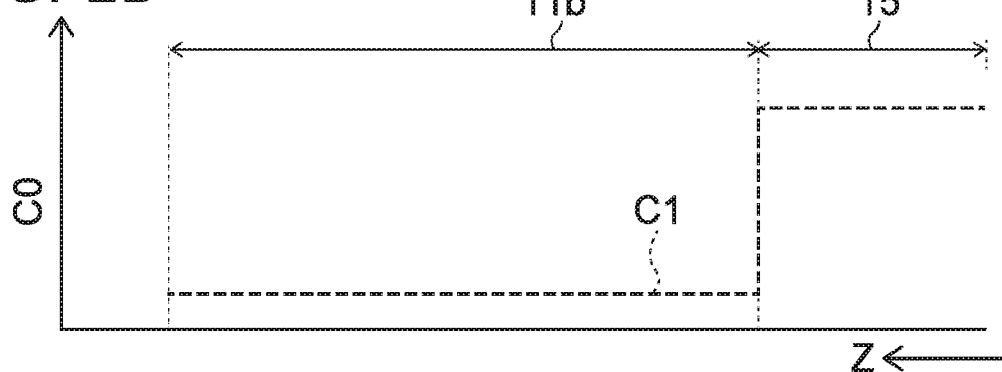

FIG. 2A and FIG. 2B are schematic views illustrating the semiconductor device according to the first embodiment.

These figures show an example of the distributions of the concentrations of the elements along the Z-axis direction (the depth direction). FIG. 2A corresponds to the distributions of the concentrations along the first line L1. FIG. 2B corresponds to the distributions of the concentrations along the second line L2. In these figures, the horizontal axis is the position along the Z-axis direction. In these figures, the vertical axis is a concentration C0 of the elements. For example, these figures schematically illustrate results obtained by SIMS analysis (e.g., the depth-direction distribution).

As shown in FIG. 2B, a concentration C1 of the impurity (N (nitrogen)) of the first conductivity type (the n-type) is substantially constant in the second partial region 11b at the position of the second line L2. Other elements substantially are not observed at the position of the second line L2.

As shown in FIG. 2A, a concentration C2 of the impurity (Al) of the second conductivity type (the p-type) and a concentration CE1 of the first element recited above are observed in addition to the concentration C1 at the position of the first line L1. The concentration C2 is high in the fourth partial region 12d of the second semiconductor region 12. On the other hand, the concentration CE1 of the first element is high in the fourth semiconductor region 14.

Due to such a profile of the concentration CE1 of the first element, for example, the minority carrier lifetime is short in the fourth semiconductor region 14 compared to the other regions. For example, the density of the holes reaching the "lower portion" of the first semiconductor region 11 can be low. For example, the degradation of the characteristics of the body diode can be suppressed.

For example, such a profile of the concentration CE1 of the first element can be formed by implanting the first element recited above into a portion of the first semiconductor region 11 via a portion of the second semiconductor region 12. The appropriate profile can be formed by adjusting the energy of the implantation. For example, the profile of the concentration CE1 of the first element recited above may be formed by epitaxial growth.

As shown in FIG. 2A, for example, the first partial region 11a does not include the first element. Or, the concentration CE1 of the first element in the first partial region 11a is lower than the concentration CE1 of the first element in the fourth semiconductor region 14.

As shown in FIG. 2B, for example, the second partial region 11b does not include the first element. Or, the concentration CE1 of the first element in the second partial region 11b is lower than the concentration CE1 of the first element in the fourth semiconductor region 14.

For example, as shown in FIG. 1, the direction from the third partial region 11c toward the fourth semiconductor region 14 is aligned with the second direction (e.g., the X-axis direction). For example, the third partial region 11c may not include the first element. Or, the concentration CE1 of the first element in the third partial region 11c may be lower than the concentration CE1 of the first element in the fourth semiconductor region 14.

The concentration CE1 of the first element in the fourth semiconductor region 14 is, for example, not less than $1 \times 10^{13}$ cm$^{-3}$ and not more than $1 \times 10^{18}$ cm$^{-3}$. In the case where the concentration CE1 of the first element is excessively low, for example, the effect of the minority carrier lifetime becoming short is small. In the case where the concentration CE1 of the first element is excessively high, for example, the crystallinity becomes low; and there are cases where the diode characteristic between the source and drain degrades markedly. For example, there are cases where the electrical characteristics of the semiconductor device degrade.

Second Embodiment

In a second embodiment, the configuration of the fourth semiconductor region 14 is different from the configuration in the first embodiment. An example of the configuration of the fourth semiconductor region 14 of the second embodiment will now be described.

In the embodiment, the concentration of the first element, i.e., at least one of silicon or carbon, in the fourth semiconductor region 14 is higher than the concentration of the first element in the first partial region 11a.

For example, the fourth semiconductor region 14 may have at least one of the following first state and the following second state.

In the first state, the concentration of the first element, i.e., one of silicon or carbon, in the fourth semiconductor region 14 is higher than the concentration of the first element in the first partial region 11a.

In the second state, the concentration of a second element, i.e., the other of silicon or carbon, in the fourth semiconductor region 14 is lower than the concentration of the second element in the first partial region 11a.

For example, in the case where the first element is silicon, the concentration of silicon in the fourth semiconductor region 14 is higher than the concentration of silicon in the first partial region 11a. For example, the first partial region 11a is a stoichiometric crystal. For example, the fourth semiconductor region 14 is silicon-rich silicon carbide (the first state). In such a case, the fourth semiconductor region 14 is carbon-poor silicon carbide (the second state).

For example, in the case where the first element is carbon, the concentration of carbon in the fourth semiconductor region 14 is higher than the concentration of carbon in the first partial region 11a. For example, the first partial region 11a is a stoichiometric crystal. For example, the fourth semiconductor region 14 is carbon-rich silicon carbide (the first state). In such a case, the fourth semiconductor region 14 is silicon-poor silicon carbide (the second state). In such a state, distortion occurs easily in the crystal.

For example, the concentration of silicon and the concentration of carbon in the fourth semiconductor region 14 may be higher than in the other regions (e.g., the first partial region 11a, etc.). In such a case, excess silicon or carbon is positioned between the crystal lattice of the silicon carbide. Even in such a case, the distortion is generated in the crystal.

Such a state is obtained by introducing (implanting) at least one element of silicon or carbon selectively into the fourth semiconductor region 14. The concentration of the at least one element of silicon or carbon that is introduced is, for example, not less than $1 \times 10^{14}$ cm$^{-2}$ and not more than $1 \times 10^{15}$ cm$^{-2}$.

In such a fourth semiconductor region 14, for example, the density of the crystal defects is high compared to the other regions. Thereby, for example, the minority carrier lifetime becomes short in the fourth semiconductor region 14 compared to the other regions. For example, the density of the holes reaching the "lower portion" of the first semiconductor region 11 from the source portion can be low. For example, the degradation of the characteristics of the body diode can be suppressed.

An example of the profile of the concentration of the first element in the second embodiment will now be described.

Figure 3A:
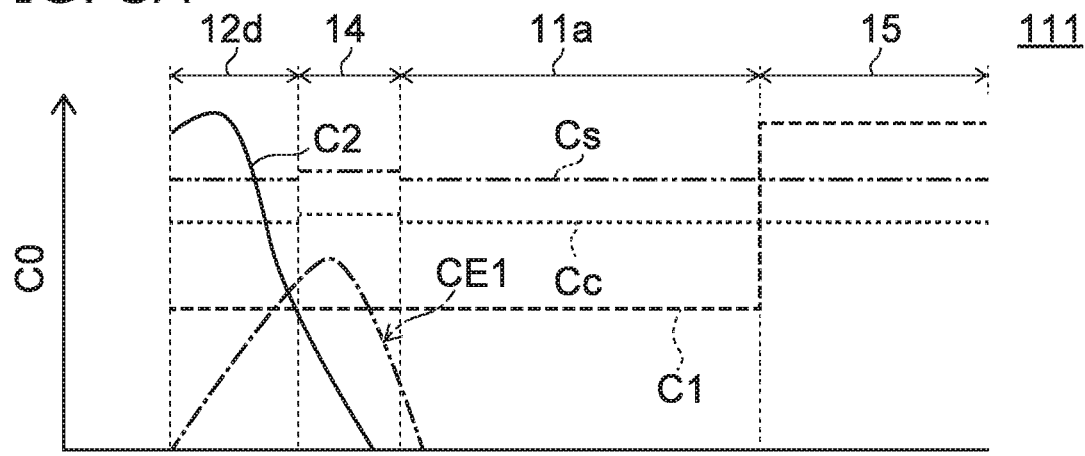
FIG. 3A and FIG. 3B are schematic views illustrating a semiconductor device according to a second embodiment.
Figure 3B:
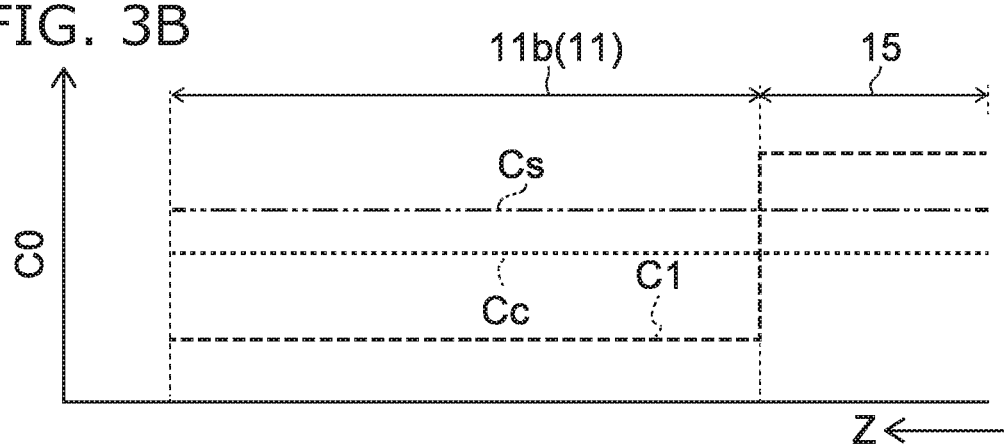

FIG. 3A and FIG. 3B are schematic views illustrating a semiconductor device according to the second embodiment.

These figures show an example of the distributions of the concentrations of the elements along the Z-axis direction (the depth direction) in the semiconductor device 111 according to the embodiment. The structure of the semiconductor device 111 is similar to the structure of the semiconductor device 110 of FIG. 1. FIG. 3A corresponds to the first line L1. FIG. 3B corresponds to the second line L2.

As shown in FIG. 3B, a concentration Cs of silicon and a concentration Cc of carbon are substantially constant at the position of the second line L2.

At the position of the first line L1 as shown in FIG. 3A, the concentration Cs of silicon and the concentration Cc of carbon in the fourth semiconductor region 14 are slightly high compared to the other regions.

In the embodiment, there may be a case where the difference between the concentrations of the first element is not observed clearly when the first element (the at least one of silicon or carbon) is introduced selectively to the fourth semiconductor region 14.

Even in such a case, the characteristics relating to the crystal defects may be observed. For example, the distortion inside the lattice in the fourth semiconductor region 14 may be observed as the existence of point defects by observations using TEM.

For example, tensile stress is generated easily in the fourth semiconductor region 14 by selectively introducing the first element (the at least one of silicon or carbon) to the fourth semiconductor region 14.

For example, the fourth semiconductor region 14 and the second partial region 11b have one of the following first to third states.

In the first state, the fourth semiconductor region 14 has tensile stress; and the second partial region 11b has compressive stress.

In the second state, the fourth semiconductor region 14 has tensile stress; the second partial region 11b has tensile stress; and the tensile stress in the fourth semiconductor region 14 is larger than the tensile stress in the second partial region 11b.

In the third state, the fourth semiconductor region 14 has compressive stress; the second partial region 11b has compressive stress; and the compressive stress in the fourth semiconductor region 14 is smaller than the compressive stress in the second partial region 11b.

A difference of the Raman shift may be observed according to such a difference of the stress.

Figure 4:
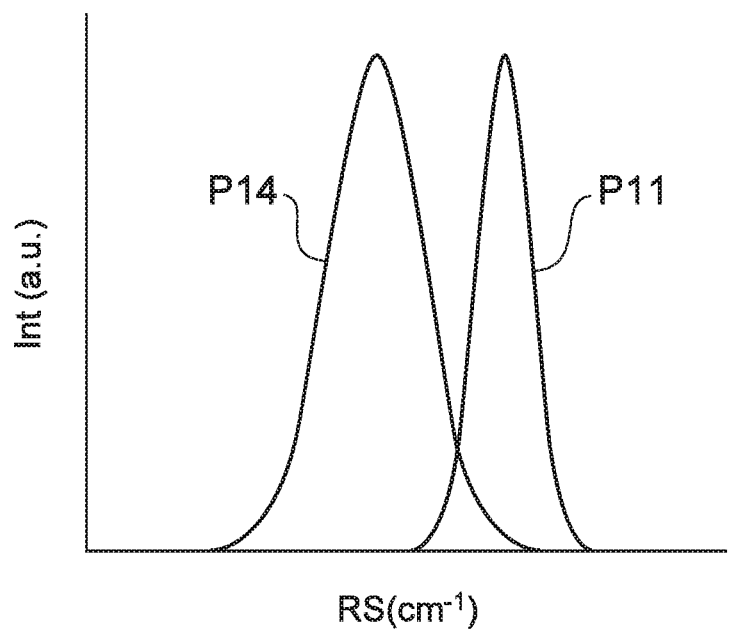
FIG. 4 is a graph illustrating characteristics of the semiconductor device.

FIG. 4 is a graph illustrating characteristics of the semiconductor device.

The horizontal axis of FIG. 4 is a wave number RS (cm$^{-1}$) of the Raman shift. The vertical axis is an intensity Int (arbitrary units). As shown in FIG. 4, a peak P11 of the first semiconductor region 11 (e.g., the second partial region 11b) has, for example, a peak corresponding to unstrained SiC. On the other hand, a peak P14 of the Raman shift of the fourth semiconductor region 14 is shifted from the peak (the peak P11) corresponding to the SiC. The shift is caused by the relative tensile stress (tensile strain) in the fourth semiconductor region 14.

For example, the density of the crystal defects in the fourth semiconductor region 14 is higher than the density of the crystal defects in the other regions (e.g., the second partial region 11b). Such a difference between the densities of the crystal defects may be observed as the difference between the PL characteristics.

FIG. 5A and FIG. 5B are graphs illustrating the characteristics of the semiconductor device.

These figures illustrate the PL characteristics in the semiconductor regions. The horizontal axis is a wavelength Lm (nm (nanometers)). The vertical axis is an intensity IPL (arbitrary units). FIG. 5A corresponds to a first characteristic PL1 in a region of many crystal defects. FIG. 5B corresponds to a second characteristic PL2 in a region of few crystal defects. The region of few crystal defects is epitaxially-grown SiC. The region of many crystal defects corresponds to a state after the first element is implanted into the epitaxially-grown SiC.

For the first characteristic PL1 as shown in FIG. 5A, the intensity IPL when the wavelength Lm is 500 nm is higher than the intensity IPL when the wavelength Lm is 390 nm.

For the second characteristic PL2 as shown in FIG. 5B, the intensity IPL when the wavelength Lm is 500 nm is lower than the intensity IPL when the wavelength Lm is 390 nm.

For example, the first characteristic PL1 is obtained in the fourth semiconductor region 14. For example, the second characteristic PL2 is obtained in the second partial region 11b.

For example, the ratio of the intensity at 500 nm for the photoluminescence of the fourth semiconductor region 14 to the intensity at 390 nm for the photoluminescence of the fourth semiconductor region 14 is higher than the ratio of the intensity at 500 nm for the photoluminescence of the second partial region 11b to the intensity at 390 nm for the photoluminescence of the second partial region 11b.

By providing such a fourth semiconductor region 14, for example, a semiconductor device can be provided in which it is possible to stabilize the characteristics.

The characteristics described in reference to FIG. 4, FIG. 5A, and FIG. 5B may be obtained for the semiconductor device 110.

Third Embodiment

In a third embodiment, the state of the impurities in the fourth semiconductor region 14 is different from the state of the impurities in the other regions. Otherwise, the third embodiment is similar to the first embodiment. An example of the state of the impurities in the fourth semiconductor region 14 and the state of the impurities in the other regions (the first partial region 11a and the fourth partial region 12d) for the third embodiment will now be described.

The first partial region 11a includes the first element. The first element includes at least one selected from the group consisting of nitrogen and phosphorus. The first element is an n-type impurity. The first partial region 11a is of the n-type.

The fourth partial region 12d includes the second element. The second element includes at least one selected from the group consisting of aluminum and boron. The second element is a p-type impurity. The fourth partial region 12d is of the p-type.

The fourth semiconductor region 14 includes the first element and the second element.

In such a case, the fourth partial region 12d does not include the first element. Thereby, the fourth partial region 12d is of the p-type. The first partial region 11a substantially does not include the second element. The fourth semiconductor region 14 includes the first element and the second element. The concentrations of these elements in the fourth semiconductor region 14 are higher than the concentrations of these elements in the fourth partial region 12d. The concentrations of these elements in the fourth semiconductor region 14 are higher than the concentrations of these elements in the first partial region 11a.

Or, there may be a case where the fourth partial region 12d includes the first element. In such a case, the first concentration of the first element included in the fourth partial region 12d is lower than the second concentration of the second element included in the fourth partial region 12d. In other words, the fourth partial region 12d is of the p-type. Then, the difference between the first concentration and the second concentration is larger than the difference between the third concentration of the first element included in the fourth semiconductor region 14 and the fourth concentration of the second element included in the fourth semiconductor region 14. For example, the p-type carrier concentration in the fourth semiconductor region 14 is lower than the n-type carrier concentration in the fourth partial region 12d.

The fourth semiconductor region 14 is a region where the impurity concentration is high. Thereby, for example, compared to the other regions, the minority carrier lifetime is short in the fourth semiconductor region 14. For example, the density of the holes reaching the "lower portion" of the first semiconductor region 11 from the source portion can be low. For example, the degradation of the characteristics of the body diode can be suppressed.

FIG. 6A and FIG. 6B are schematic views illustrating a semiconductor device according to the third embodiment.

These figures show an example of the distributions of the concentrations of the elements along the Z-axis direction (the depth direction) in the semiconductor device 112 according to the embodiment. The structure of the semiconductor device 112 is similar to the structure of the semiconductor device 110 of FIG. 1. FIG. 6A corresponds to the first line L1. FIG. 6B corresponds to the second line L2.

At the position of the second line L2 as shown in FIG. 6B, the concentration C1 of the impurity (N (nitrogen)) of the first conductivity type (the n-type) is substantially constant in the second partial region 11b. At the position of the second line L2, other elements substantially are not observed.

At the position of the first line L1 as shown in FIG. 6A, the concentration C2 of the impurity of the second conductivity type (the p-type) is observed in addition to the concentration C1. In the example, the impurity of the second conductivity type includes Al and B. The concentration C2 is high in the fourth partial region 12d. The concentration C2 is higher than the concentration C1 in the fourth partial region 12d.

In the fourth semiconductor region 14, the concentration C1 is high; and the concentration C2 also is relatively high. In the fourth semiconductor region 14, the concentration C1 is higher than the concentration C2. A region RD1 where the donor concentration is higher than the acceptor concentration is provided in the fourth semiconductor region 14.

Due to such a fourth semiconductor region 14, for example, compared to the other regions, the minority carrier lifetime is short in the fourth semiconductor region 14. For example, the density of the holes reaching the "lower portion" of the first semiconductor region 11 can be low. For example, the degradation of the characteristics of the body diode can be suppressed.

Figure 7A:
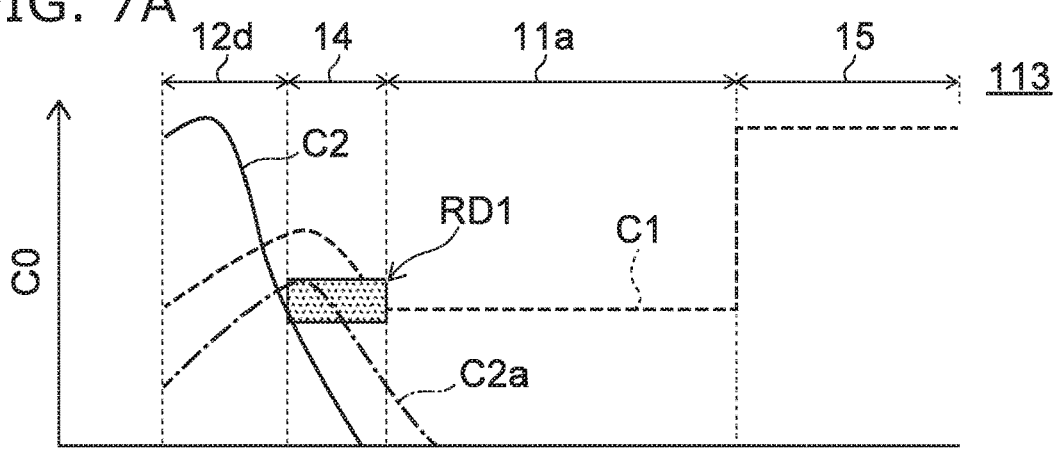
FIG. 7A and FIG. 7B are schematic views illustrating a semiconductor device according to the third embodiment.
Figure 7B:
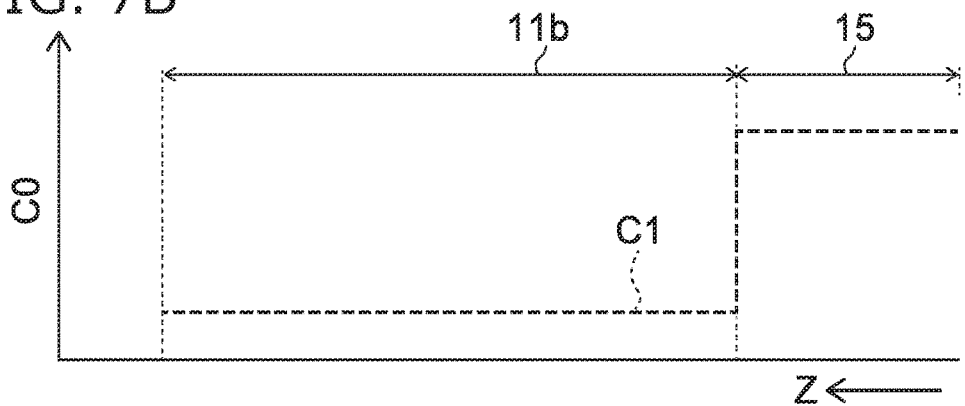

FIG. 7A and FIG. 7B are schematic views illustrating a semiconductor device according to the third embodiment.

These figures show an example of the distributions of the concentrations of the elements along the Z-axis direction (the depth direction) in the semiconductor device 113 according to the embodiment. The structure of the semiconductor device 113 is similar to the structure of the semiconductor device 110 of FIG. 1. FIG. 7A corresponds to the first line L1. FIG. 7B corresponds to the second line L2.

At the position of the second line L2 as shown in FIG. 7B, the concentration C1 is substantially constant in the second partial region 11b. Other elements substantially are not observed at the position of the second line L2.

At the position of the first line L1 as shown in FIG. 7A, the concentration C2 and a concentration C2a of the impurity of the second conductivity type (the p-type) are observed in addition to the concentration C1. In the example, the concentration C2 is the concentration of Al. The concentration C2a is the concentration of B.

In the example as well, the region RD1 where the donor concentration is higher than the acceptor concentration is provided in the fourth semiconductor region 14. Due to such a fourth semiconductor region 14, for example, compared to the other regions, the minority carrier lifetime is short in the fourth semiconductor region 14. For example, the density of the holes reaching the "lower portion" of the first semiconductor region 11 can be low. For example, the degradation of the characteristics of the body diode can be suppressed.

In the third embodiment, for example, the third concentration may be not less than 0.8 times and not more than 1.2 times the fourth concentration. The third concentration may be substantially the same as the fourth concentration.

The profiles illustrated in FIG. 2A, FIG. 2B, FIG. 3A, FIG. 3B, FIG. 6A, FIG. 6B, FIG. 7A, and FIG. 7B may be formed by epitaxial growth. For example, the concentration C1 on the front surface side (the region including the fourth partial region 12d) may be lower than the concentration C1 on the substrate side (the fifth semiconductor region 15 side).

Figure 8:
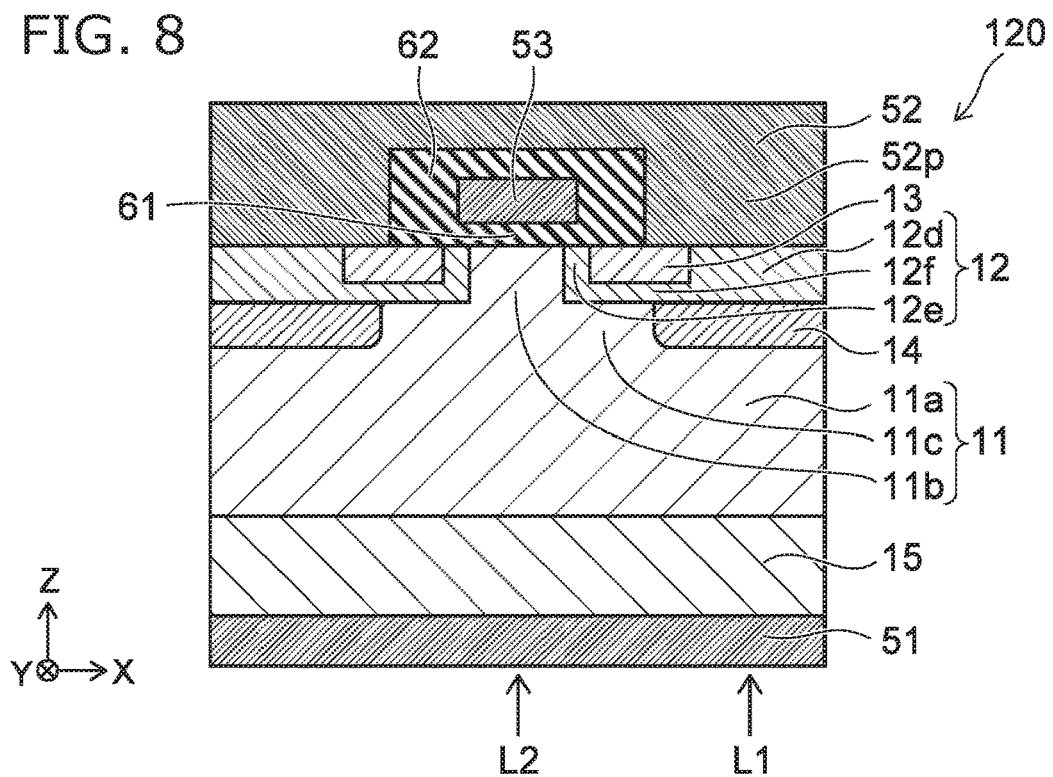
FIG. 8 is a schematic cross-sectional view illustrating a semiconductor device according to the embodiment.

FIG. 8 is a schematic cross-sectional view illustrating a semiconductor device according to the embodiment.

In the semiconductor device 120 according to the embodiment as shown in FIG. 8, the fourth semiconductor region 14 is positioned under the third semiconductor region 13. For example, the sixth partial region 12f may overlap at least a portion of the fourth semiconductor region 14 in the first direction (the Z-axis direction).

Figure 9:
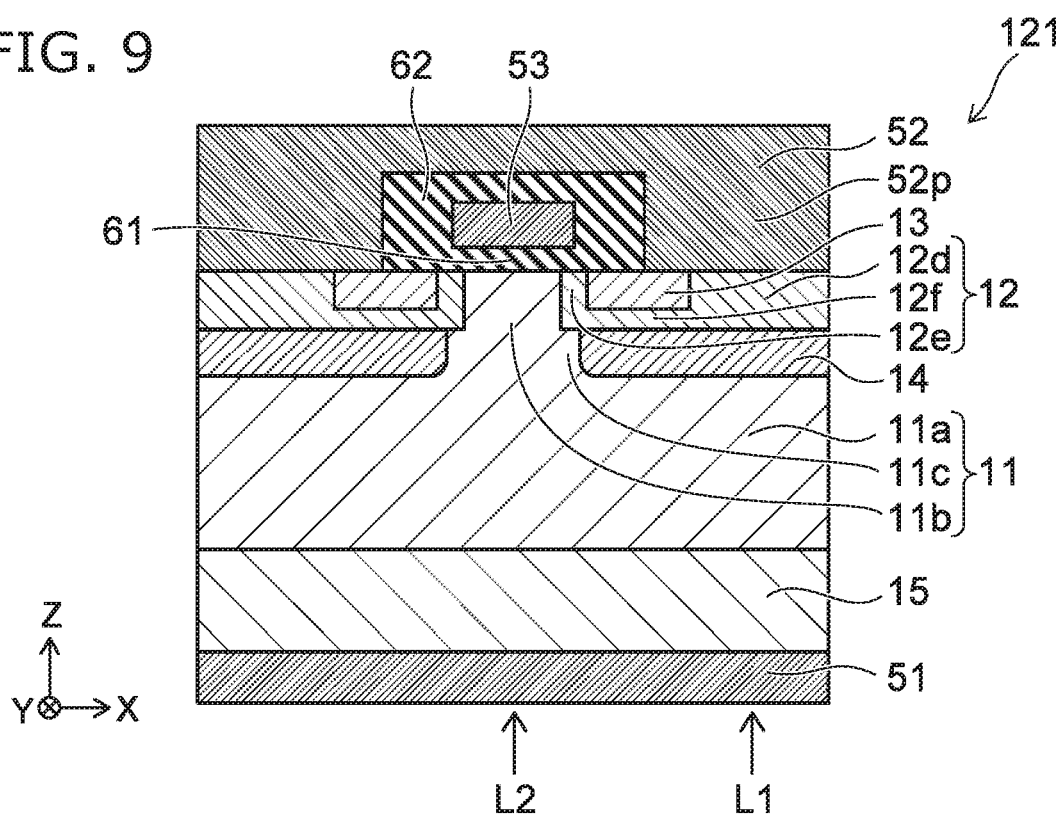
FIG. 9 is a schematic cross-sectional view illustrating a semiconductor device according to the embodiment.

FIG. 9 is a schematic cross-sectional view illustrating a semiconductor device according to the embodiment.

In the semiconductor device 121 according to the embodiment as shown in FIG. 9, a portion of the fourth semiconductor region 14 is positioned under the fifth partial region 12e. For example, the fifth partial region 12e may overlap at least a portion of the fourth semiconductor region 14 in the first direction (the Z-axis direction).

Figure 10:
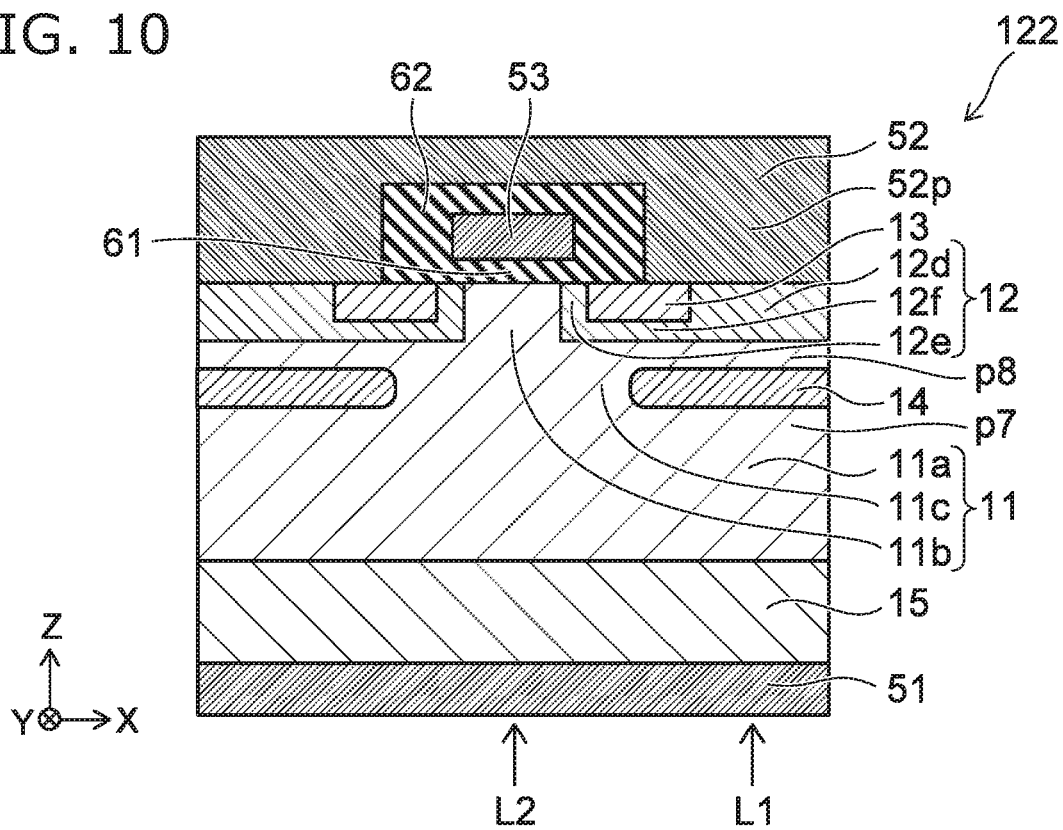
FIG. 10 is a schematic cross-sectional view illustrating a semiconductor device according to the embodiment.

FIG. 10 is a schematic cross-sectional view illustrating a semiconductor device according to the embodiment.

In the semiconductor device 122 according to the embodiment as shown in FIG. 10, the fourth semiconductor region 14 is provided partway through the first semiconductor region 11 in the thickness direction.

For example, the first partial region 11a includes a seventh partial region p7 and an eighth partial region p8. The fourth semiconductor region 14 may be provided between the seventh partial region p7 and the eighth partial region p8 in the first direction (the Z-axis direction).

For example, it is favorable for the fourth semiconductor region 14 not to be included in the channel portion. For example, the distance along the first direction between the fourth partial region 12d and the fourth semiconductor region 14 (the depth of the fourth semiconductor region 14) is shorter than the distance along the second direction (the X-axis direction) between the fourth semiconductor region 14 and the boundary between the second partial region 11b and the fifth partial region 12e (the end portion of the channel). For example, the angle between the Z-axis direction and the line segment connecting the lower end portion of the fourth semiconductor region 14 and the boundary between the second partial region 11b and the fifth partial region 12e is 45 degrees or more.

For example, there are cases where the electrical characteristics are affected when the lower end portion of the fourth semiconductor region 14 approaches the channel end portion excessively. For example, the on-resistance of the transistor becomes high. For example, the negative effects on the electrical characteristics can be suppressed by setting the angle recited above to be 45 degrees or more.

As shown in FIG. 1, etc., for example, it is favorable for the length (the thickness) along the first direction (the Z-axis direction) of the fourth semiconductor region 14 to be shorter than the length (the thickness) along the first direction of the first partial region 11a.

It is favorable for the length (the thickness) along the first direction of the fourth semiconductor region 14 not to be more than the length (the thickness) along the first direction of the fourth partial region 12d.

As shown in FIG. 1, the fourth partial region 12d is electrically connected to the portion 52p of the second electrode 52 recited above. The potential of the second semiconductor region 12 becomes stable.

For example, the third electrode 53 does not overlap the third semiconductor region 13 in the first direction (the Z-axis direction). For example, the third electrode 53 overlaps the fifth partial region 12e in the first direction. The first insulating portion 61 may include, for example, a portion provided between the fifth partial region 12e and the third electrode 53.

Figure 11:
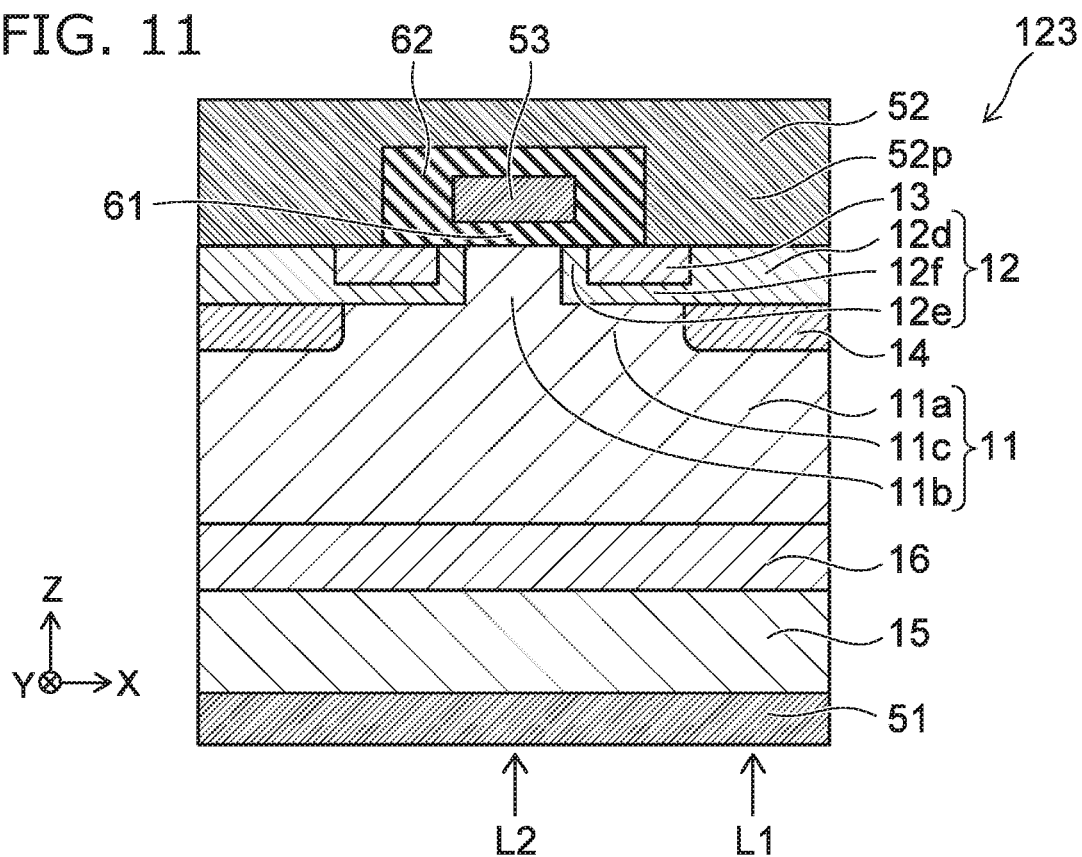
FIG. 11 is a schematic cross-sectional view illustrating a semiconductor device according to the embodiment.

FIG. 11 is a schematic cross-sectional view illustrating a semiconductor device according to the embodiment.

According to the embodiment as shown in FIG. 11, a sixth semiconductor region 16 is further provided in the semiconductor device 123. The sixth semiconductor region 16 is provided between the fifth semiconductor region 15 and the first semiconductor region 11. The sixth semiconductor region 16 includes silicon carbide of the first conductivity type. For example, the concentration of the impurity of the first conductivity type in the sixth semiconductor region 16 is higher than the concentration of the impurity of the first conductivity type in the first semiconductor region 11. For example, the sixth semiconductor region 16 is an $n^+$-region.

Figure 12:
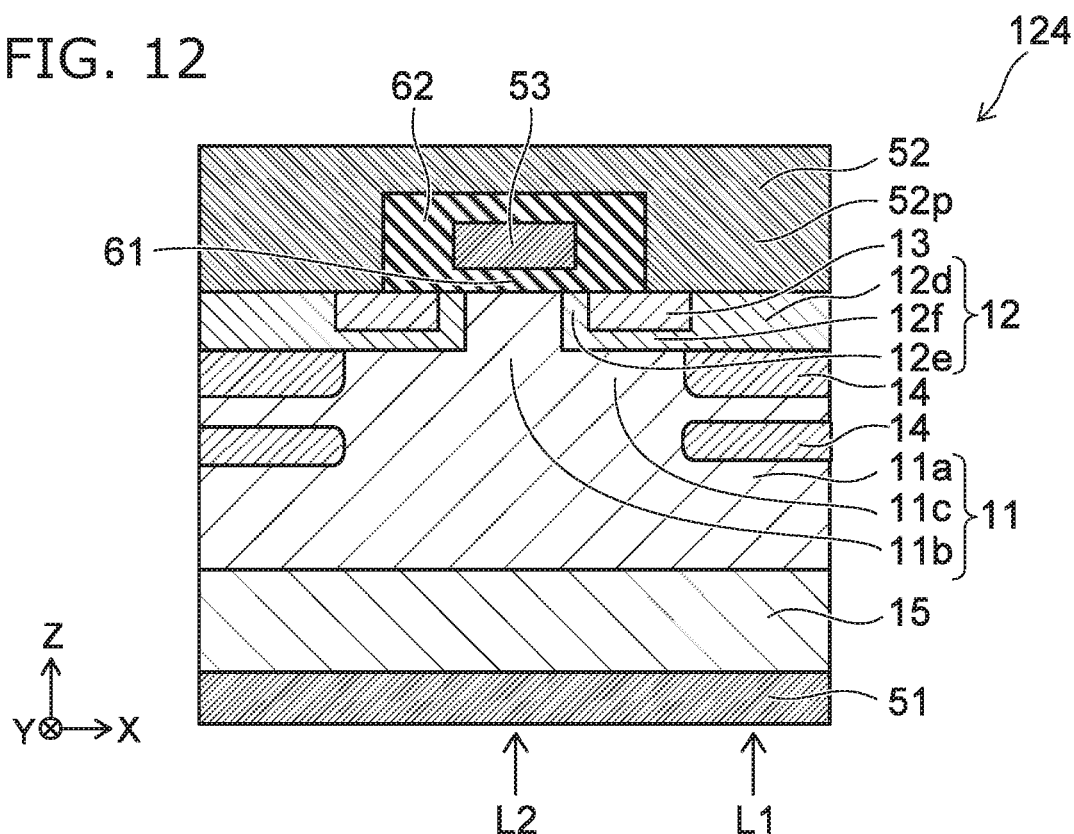
FIG. 12 is a schematic cross-sectional view illustrating a semiconductor device according to the embodiment.
Figure 13:
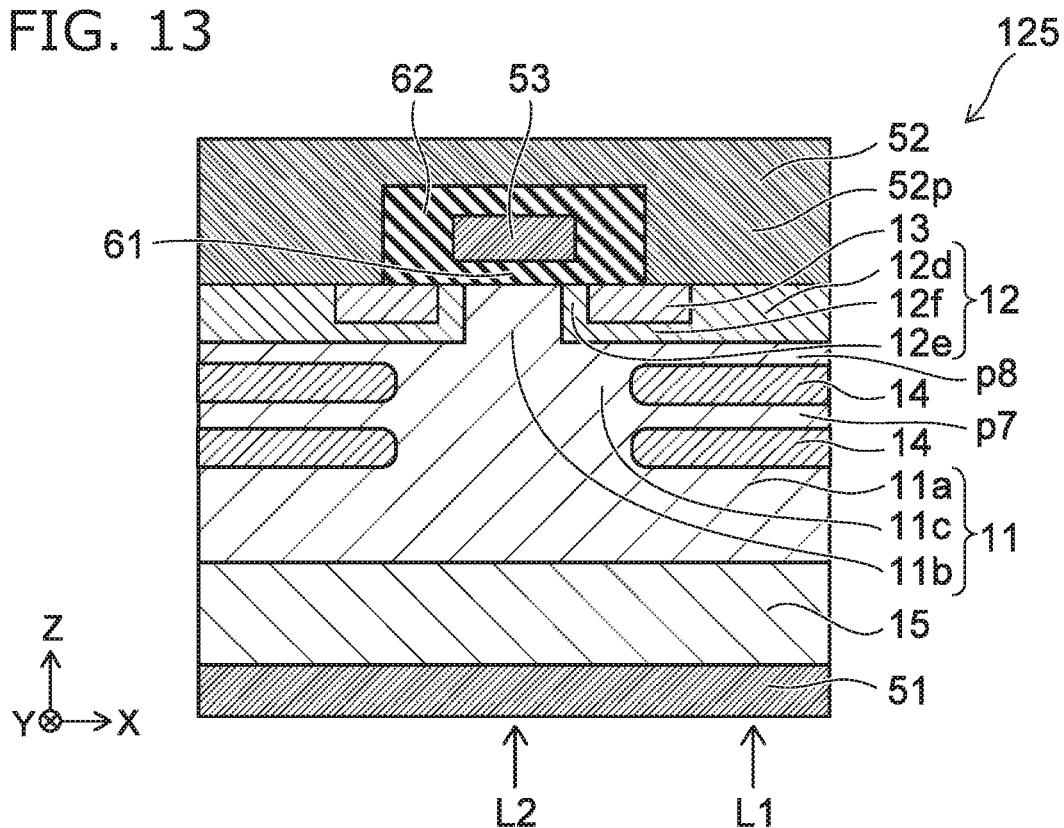
FIG. 13 is a schematic cross-sectional view illustrating a semiconductor device according to the embodiment.

FIG. 12 and FIG. 13 are schematic cross-sectional views illustrating semiconductor devices according to the embodiment.

Multiple fourth semiconductor regions 14 may be provided as in the semiconductor devices 124 and 125 shown in FIG. 12 and FIG. 13. The direction from one of the multiple fourth semiconductor regions 14 toward another one of the multiple fourth semiconductor regions 14 is aligned with the first direction (the Z-axis direction). A portion of the first semiconductor region 11 is provided between the one of the multiple semiconductor regions 14 and the other one of the multiple fourth semiconductor regions 14. The degradation of the characteristics of the body diode can be suppressed in the semiconductor devices 124 and 125 as well. The characteristics can be stabilized.

According to the embodiments, a semiconductor device can be provided in which it is possible to stabilize the characteristics.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, semiconductor regions, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode, a direction from the first electrode toward a portion of the second electrode being aligned with a first direction;
a third electrode, a direction from the first electrode toward the third electrode being aligned with the first direction, a second direction from the third electrode toward the portion of the second electrode crossing the first direction;
a first semiconductor region including silicon carbide of a first conductivity type, the first semiconductor region including first to third partial regions, the first partial region being provided between the first electrode and the portion of the second electrode in the first direction, the second partial region being provided between the first electrode and the third electrode in the first direction, a position along the second direction of the third partial region being between a position along the second direction of the first partial region and a position along the second direction of the second partial region;
a second semiconductor region including silicon carbide of a second conductivity type, the second semiconductor region including fourth to sixth partial regions, the fourth partial region being provided between the first partial region and the portion of the second electrode in the first direction;
a third semiconductor region including silicon carbide of the first conductivity type and being electrically connected to the portion of the second electrode, the fifth partial region being provided between the third semiconductor region and at least a portion of the second partial region in the second direction, the sixth partial region being provided between the third partial region and the third semiconductor region in the first direction;
a fourth semiconductor region including silicon carbide, including at least one first element selected from the group consisting of Ar, Kr, Xe, Rn, Ti, and V, and being provided between the first partial region and the fourth partial region in the first direction; and
a first insulating portion provided between the second partial region and the third electrode.

2. The device according to claim 1, wherein
the first partial region does not include the first element, or
a concentration of the first element in the first partial region is lower than a concentration of the first element in the fourth semiconductor region.

3. The device according to claim 1, wherein
a direction from the third partial region toward the fourth semiconductor region is aligned with the second direction, and
the third partial region does not include the first element, or a concentration of the first element in the third partial region is lower than a concentration of the first element in the fourth semiconductor region.

4. The device according to claim 1, wherein a concentration of the first element in the fourth semiconductor region is not less than $1 \times 10^{13}$ cm$^{-3}$ and not more than $1 \times 10^{18}$ cm$^{-3}$.

5. The device according to claim 1, wherein
the fourth semiconductor region and the second partial region have one of first to third states,
in the first state, the fourth semiconductor region has tensile stress, and the second partial region has compressive stress,
in the second state, the fourth semiconductor region has tensile stress, the second partial region has tensile stress, and the tensile stress in the fourth semiconductor region is larger than the tensile stress in the second partial region, and
in the third state, the fourth semiconductor region has compressive stress, the second partial region has compressive stress, and the compressive stress in the fourth semiconductor region is smaller than the compressive stress in the second partial region.

6. The device according to claim 1, wherein a ratio of an intensity at 500 nanometers for a photoluminescence of the fourth semiconductor region to an intensity at 390 nanometers for the photoluminescence of the fourth semiconductor region is higher than a ratio of an intensity at 500 nanometers for a photoluminescence of the second partial region to an intensity at 390 nanometers for the photoluminescence of the second partial region.

7. The device according to claim 1, wherein the sixth partial region overlaps at least a portion of the fourth semiconductor region in the first direction.

8. The device according to claim 1, wherein the fifth partial region overlaps at least a portion of the fourth semiconductor region in the first direction.

9. The device according to claim 1, wherein
the first partial region includes a seventh partial region and an eighth partial region, and
the fourth semiconductor region is provided between the seventh partial region and the eighth partial region in the first direction.

10. The device according to claim 1, wherein a distance along the first direction between the fourth partial region and the fourth semiconductor region is shorter than a distance along the second direction between the fourth semiconductor region and a boundary between the second partial region and the fifth partial region.

11. The device according to claim 1, wherein a length along the first direction of the fourth semiconductor region is shorter than a length along the first direction of the first partial region.

12. The device according to claim 1, wherein a length along the first direction of the fourth semiconductor region is not more than a length along the first direction of the fourth partial region.

13. The device according to claim 1, wherein the fourth partial region is electrically connected to the portion of the second electrode.

14. The device according to claim 1, further comprising a fifth semiconductor region including silicon carbide of the first conductivity type and being provided between the first electrode and the first semiconductor region.

15. The device according to claim 14, further comprising a sixth semiconductor region including silicon carbide of the first conductivity type and being provided between the fifth semiconductor region and the first semiconductor region,
a concentration of an impurity of the first conductivity type in the sixth semiconductor region being higher than a concentration of the impurity of the first conductivity type in the first semiconductor region.

16. A semiconductor device, comprising:
a first electrode;

a second electrode, a direction from the first electrode toward a portion of the second electrode being aligned with a first direction;
a third electrode, a direction from the first electrode toward the third electrode being aligned with the first direction, a second direction from the third electrode toward the portion of the second electrode crossing the first direction;
a first semiconductor region including silicon carbide of a first conductivity type, the first semiconductor region including first to third partial regions, the first partial region being provided between the first electrode and the portion of the second electrode in the first direction, the second partial region being provided between the first electrode and the third electrode in the first direction, a position along the second direction of the third partial region being between a position along the second direction of the first partial region and a position along the second direction of the second partial region;
a second semiconductor region including silicon carbide of a second conductivity type, the second semiconductor region including fourth to sixth partial regions, the fourth partial region being provided between the first partial region and the portion of the second electrode in the first direction;
a third semiconductor region including silicon carbide of the first conductivity type and being electrically connected to the portion of the second electrode, the fifth partial region being provided between the third semiconductor region and at least a portion of the second partial region in the second direction, the sixth partial region being provided between the third partial region and the third semiconductor region in the first direction;
a fourth semiconductor region including silicon carbide and being provided between the first partial region and the fourth partial region in the first direction, a concentration of a first element in the fourth semiconductor region being higher than a concentration of the first element in the first partial region, the first element being at least one of silicon or carbon; and
a first insulating portion provided between the second partial region and the third electrode.

17. A semiconductor device, comprising:
a first electrode;
a second electrode, a direction from the first electrode toward a portion of the second electrode being aligned with a first direction;
a third electrode, a direction from the first electrode toward the third electrode being aligned with the first direction, a second direction from the third electrode toward the portion of the second electrode crossing the first direction;
a first semiconductor region including silicon carbide of a first conductivity type, the first semiconductor region including first to third partial regions, the first partial region being provided between the first electrode and the portion of the second electrode in the first direction, the second partial region being provided between the first electrode and the third electrode in the first direction, a position along the second direction of the third partial region being between a position along the second direction of the first partial region and a position along the second direction of the second partial region;
a second semiconductor region including silicon carbide of a second conductivity type, the second semiconductor region including fourth to sixth partial regions, the fourth partial region being provided between the first partial region and the portion of the second electrode in the first direction;
a third semiconductor region including silicon carbide of the first conductivity type and being electrically connected to the portion of the second electrode, the fifth partial region being provided between the third semiconductor region and at least a portion of the second partial region in the second direction, the sixth partial region being provided between the third partial region and the third semiconductor region in the first direction;
a fourth semiconductor region including silicon carbide and being provided between the first partial region and the fourth partial region in the first direction; and
a first insulating portion provided between the second partial region and the third electrode,
the first partial region including a first element including at least one selected from the group consisting of nitrogen and phosphorus,
the fourth partial region including a second element including at least one selected from the group consisting of aluminum and boron,
the fourth semiconductor region including the first element and the second element,
the fourth partial region not including the first element; or the fourth partial region including the first element, a first concentration of the first element included in the fourth partial region being lower than a second concentration of the second element included in the fourth partial region, and a difference between the first concentration and the second concentration being larger than a difference between a third concentration and a fourth concentration, the third concentration being of the first element included in the fourth semiconductor region, the fourth concentration being of the second element included in the fourth semiconductor region.

18. The device according to claim 6, wherein the third concentration is not less than 0.8 times and not more than 1.2 times the fourth concentration.

19. A semiconductor device, comprising:
a first electrode;
a second electrode, a direction from the first electrode toward a portion of the second electrode being aligned with a first direction;
a third electrode, a direction from the first electrode toward the third electrode being aligned with the first direction, a second direction from the third electrode toward the portion of the second electrode crossing the first direction;
a first semiconductor region including silicon carbide of a first conductivity type, the first semiconductor region including first to third partial regions, the first partial region being provided between the first electrode and the portion of the second electrode in the first direction, the second partial region being provided between the first electrode and the third electrode in the first direction, a position along the second direction of the third partial region being between a position along the second direction of the first partial region and a position along the second direction of the second partial region;
a second semiconductor region including silicon carbide of a second conductivity type, the second semiconductor region including fourth to sixth partial regions, the fourth partial region being provided between the first partial region and the portion of the second electrode in the first direction;

a third semiconductor region including silicon carbide of the first conductivity type and being electrically connected to the portion of the second electrode, the fifth partial region being provided between the third semiconductor region and at least a portion of the second partial region in the second direction, the sixth partial region being provided between the third partial region and the third semiconductor region in the first direction;

a fourth semiconductor region including silicon carbide and being provided between the first partial region and the fourth partial region in the first direction; and a first insulating portion provided between the second partial region and the third electrode, the fourth semiconductor region and the second partial region having one of first to third states, in the first state, the fourth semiconductor region having tensile stress, and the second partial region having compressive stress, in the second state, the fourth semiconductor region having tensile stress, the second partial region having tensile stress, and the tensile stress in the fourth semiconductor region being larger than the tensile stress in the second partial region, in the third state, the fourth semiconductor region having compressive stress, the second partial region having compressive stress, and the compressive stress in the fourth semiconductor region being smaller than the compressive stress in the second partial region.

20. A semiconductor device, comprising:

a first electrode;

a second electrode, a direction from the first electrode toward a portion of the second electrode being aligned with a first direction;

a third electrode, a direction from the first electrode toward the third electrode being aligned with the first direction, a second direction from the third electrode toward the portion of the second electrode crossing the first direction;

a first semiconductor region including silicon carbide of a first conductivity type, the first semiconductor region including first to third partial regions, the first partial region being provided between the first electrode and the portion of the second electrode in the first direction, the second partial region being provided between the first electrode and the third electrode in the first direction, a position along the second direction of the third partial region being between a position along the second direction of the first partial region and a position along the second direction of the second partial region;

a second semiconductor region including silicon carbide of a second conductivity type, the second semiconductor region including fourth to sixth partial regions, the fourth partial region being provided between the first partial region and the portion of the second electrode in the first direction;

a third semiconductor region including silicon carbide of the first conductivity type and being electrically connected to the portion of the second electrode, the fifth partial region being provided between the third semiconductor region and at least a portion of the second partial region in the second direction, the sixth partial region being provided between the third partial region and the third semiconductor region in the first direction;

a fourth semiconductor region including silicon carbide and being provided between the first partial region and the fourth partial region in the first direction; and a first insulating portion provided between the second partial region and the third electrode, a ratio of an intensity at 500 nanometers for a photoluminescence of the fourth semiconductor region to an intensity at 380 nanometers for the photoluminescence of the fourth semiconductor region being higher than a ratio of an intensity at 500 nanometers for a photoluminescence of the second partial region to an intensity at 380 nanometers for the photoluminescence of the second partial region.

* * * * *